(12) United States Patent
Ma et al.

(10) Patent No.: US 11,609,610 B2
(45) Date of Patent: *Mar. 21, 2023

(54) DISPLAY PANEL AND DISPLAY DEVICE

(71) Applicant: WuHan TianMa Micro-electronics CO., LTD, Wuhan (CN)

(72) Inventors: Yangzhao Ma, Wuhan (CN); Xingxing Yang, Wuhan (CN); Zhiqiang Xia, Wuhan (CN); Ruiyuan Zhou, Wuhan (CN)

(73) Assignee: WuHan TianMa Micro-electronics CO., LTD, Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/505,038

(22) Filed: Oct. 19, 2021

(65) Prior Publication Data

US 2022/0035408 A1 Feb. 3, 2022

Related U.S. Application Data

(63) Continuation of application No. 16/885,764, filed on May 28, 2020, now Pat. No. 11,181,945.

(30) Foreign Application Priority Data

Jan. 3, 2020 (CN) .................. 202010005500.X

(51) Int. Cl.
  *G06F 3/041* (2006.01)
  *G06F 1/16* (2006.01)
  *G02F 1/133* (2006.01)
(52) U.S. Cl.
  CPC ........ *G06F 1/1647* (2013.01); *G02F 1/13306* (2013.01); *G06F 1/1626* (2013.01); *G06F 1/1686* (2013.01)

(58) Field of Classification Search
  CPC .. G02F 1/13306; G06F 1/1626; G06F 1/1637; G06F 1/1647; G06F 1/1686; H01L 27/3272; H01L 27/3276
  See application file for complete search history.

(56) References Cited

U.S. PATENT DOCUMENTS

| 2018/0129328 A1* | 5/2018 | Park ........................ G09G 3/20 |
| 2018/0158417 A1* | 6/2018 | Xiang .................. G09G 3/3258 |

FOREIGN PATENT DOCUMENTS

| CN | 208607570 U | 3/2019 |
| CN | 209859513 U | 12/2019 |

OTHER PUBLICATIONS

First Office Action, dated Feb. 9, 2022, State Intellectual Property Office of the People's Republic of China, Chinese Application No. 202010005500.X, 11 pages.

* cited by examiner

*Primary Examiner* — Insa Sadio
(74) *Attorney, Agent, or Firm* — Christensen O'Connor Johnson Kindness PLLC

(57) ABSTRACT

A display panel and a display device are provided. The display panel has a display area including first and second display areas. First light-emitting units and first pixel circuits are provided in the first display area, and second light-emitting units and second pixel circuits are provided in the second display area. The second display area includes at least one light-shielding area and at least one light-transmitting area. At least one second pixel circuit of the second pixel circuits is located in the at least one light-shielding area, and at least one second light-emitting unit of the second light-emitting units is located in the at least one light-transmitting area. One of the at least one second light-emitting unit is connected to one of the at least one second pixel circuit through one of anode connection lines.

23 Claims, 10 Drawing Sheets

DISPLAY PANEL AND DISPLAY DEVICE

CROSS-REFERENCE TO RELATED DISCLOSURES

This application is a continuation of U.S. patent application Ser. No. 16/885,764, filed on May 28, 2020, which claims priority to Chinese Patent Application No. 202010005500.X, filed on Jan. 3, 2020. All of the aforementioned patent applications are incorporated herein by reference in their entireties.

TECHNICAL FIELD

The present disclosure relates to the field of display technologies, and in particular, to a display panel and a display device.

BACKGROUND

With the increase of users' demands for the diversified use of display devices, and the emergence of design requirements for high screen-to-body ratios of display devices, the under-screen cameras have appeared, and photosensitive elements such as cameras are embedded on a surface facing away from the display surface of the display panel to increase the screen-to-body ratio of the display device to a greater extent.

FIG. 1 is a schematic diagram of a display panel in the related art.

As shown in FIG. 1, the display panel 1 in the related art includes a display area 11 and a camera 12. The display area 11 covers the camera 12. Multiple rows and multiple columns of pixels 111 are provided in the display area 11. The pixels 111 in the display area 11 are densely arranged and thus shield the camera 12.

SUMMARY

A first aspect of the present disclosure provides a display panel. The display panel has a display area including a first display area and a second display area. The display panel includes: first light-emitting units and first pixel circuits provided in the first display area; and second light-emitting units and second pixel circuits provided in the second display area. The second display area includes at least one light-shielding area and at least one light-transmitting area. At least one second pixel circuit of the second pixel circuits is located in the at least one light-shielding area, and at least one second light-emitting unit of the second light-emitting units is located in the at least one light-transmitting area. One of the at least one second light-emitting unit is connected to one of the at least one second pixel circuit through one of anode connection lines.

A second aspect of the present disclosure provides a display panel. The display panel has a display area including a first display area and a second display area. The display panel includes: first light-emitting units and first pixel circuits provided in the first display area; and second light-emitting units and second pixel circuits provided in the second display area. The second display area comprises at least one light-transmitting area, and one of the second light-emitting units is connected to one of the second pixel circuits through one of anode connection lines. One of the anode connection lines comprises a first connection line segment, wherein the first connection line segment is disposed in a same layer as at least one conductive layer of an anode of one of the second light-emitting units.

A third aspect of the present disclosure provides a display device including any one of the display panels as mentioned above.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings.

DESCRIPTION OF EMBODIMENTS

In order to better understand technical solutions of the present disclosure, the embodiments of the present disclosure are described in detail with reference to the drawings.

It should be clear that the described embodiments are merely part of the embodiments of the present disclosure rather than all of the embodiments. All other embodiments obtained by those skilled in the art shall fall into the protection scope of the present disclosure.

The terms used in the embodiments of the present disclosure are merely intended to describe exemplary embodiments and are not intended to limit the present disclosure. Unless otherwise noted in the context, the expressions "a", "an", "the" and "said" in singular form in the embodiments and appended claims of the present disclosure are also intended to represent a plural form.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects in front and at the back of "/" is an "or" relationship.

It should be understood that although the terms "first", "second", etc. can be used to describe devices in the embodiments of the present disclosure, these devices should not be limited to these terms. These terms are only used to distinguish devices from each other. For example, without departing from the scope of the embodiments of the present disclosure, a first device can also be referred to as a second device, and similarly, a second device can also be referred to as a first device.

Embodiments of the present disclosure provide a display panel and a display device.

Figure 1:
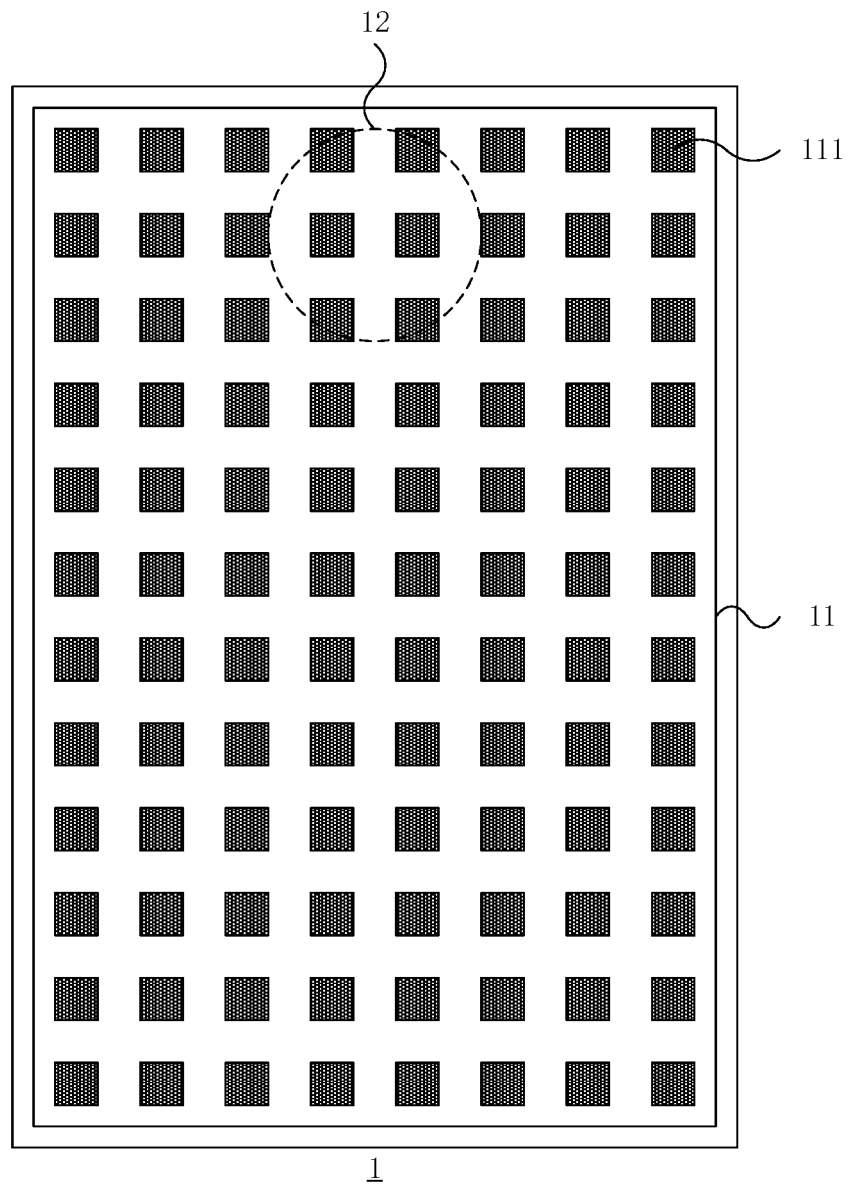
FIG. 1 is a schematic structural diagram of a display panel in the related art.
Figure 2:
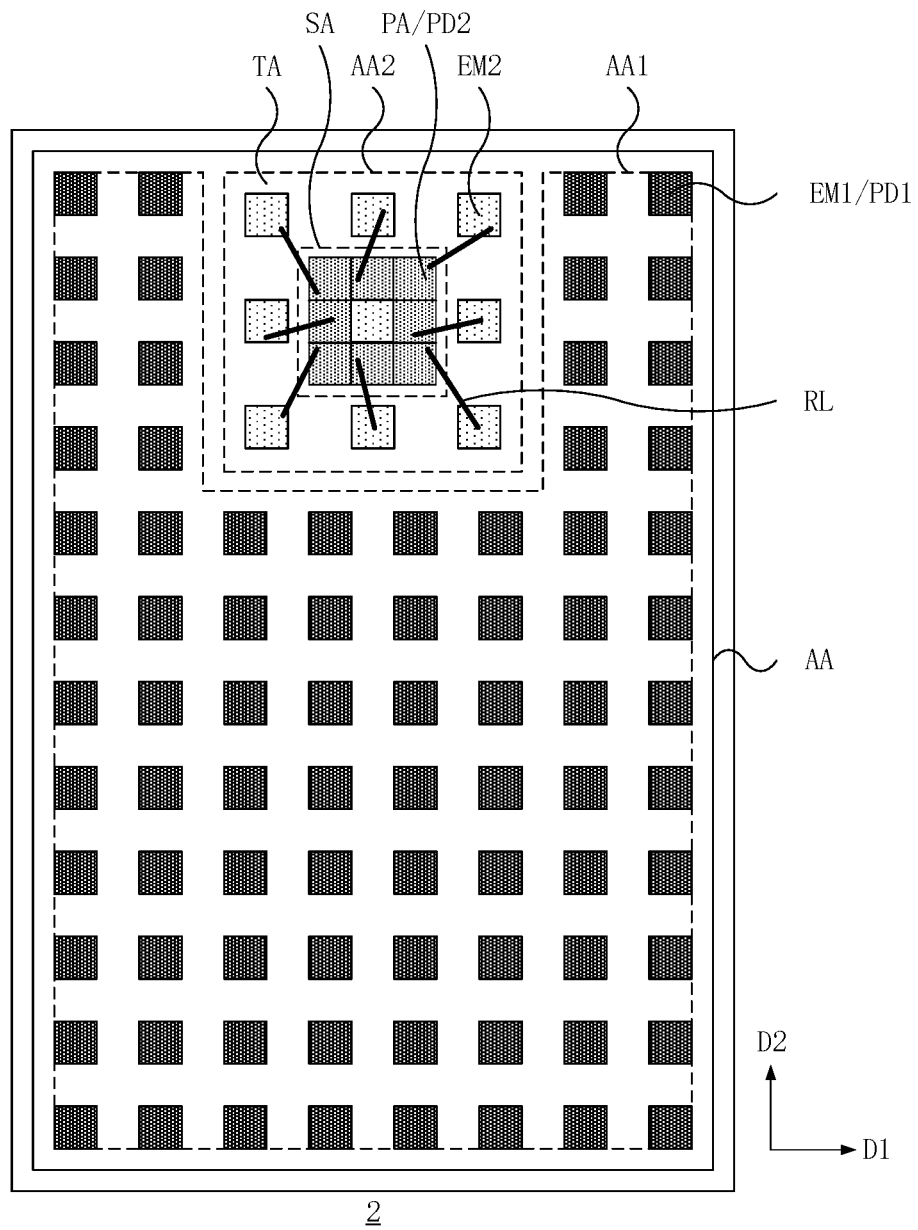
FIG. 2 is a schematic structural diagram of a display panel according to an embodiment of the present disclosure.
Figure 3:
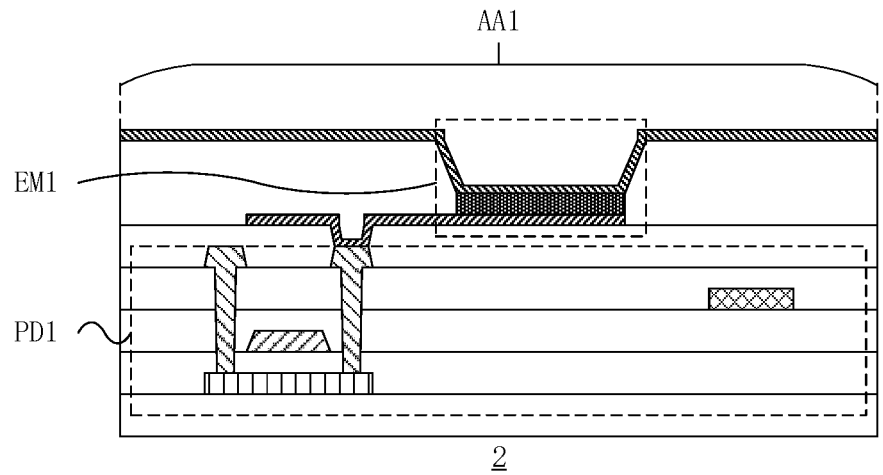
FIG. 3 is a schematic structural diagram of a first display area of a display panel according to an embodiment of the present disclosure.

FIG. 2 is a schematic structural diagram of a display panel according to an embodiment of the present disclosure; FIG. 3 is a schematic structural diagram of a first display area of a display panel according to an embodiment of the present disclosure; and FIG. 4 is a schematic structural diagram of a second display area of a display panel according to an embodiment of the present disclosure.

Figure 4:
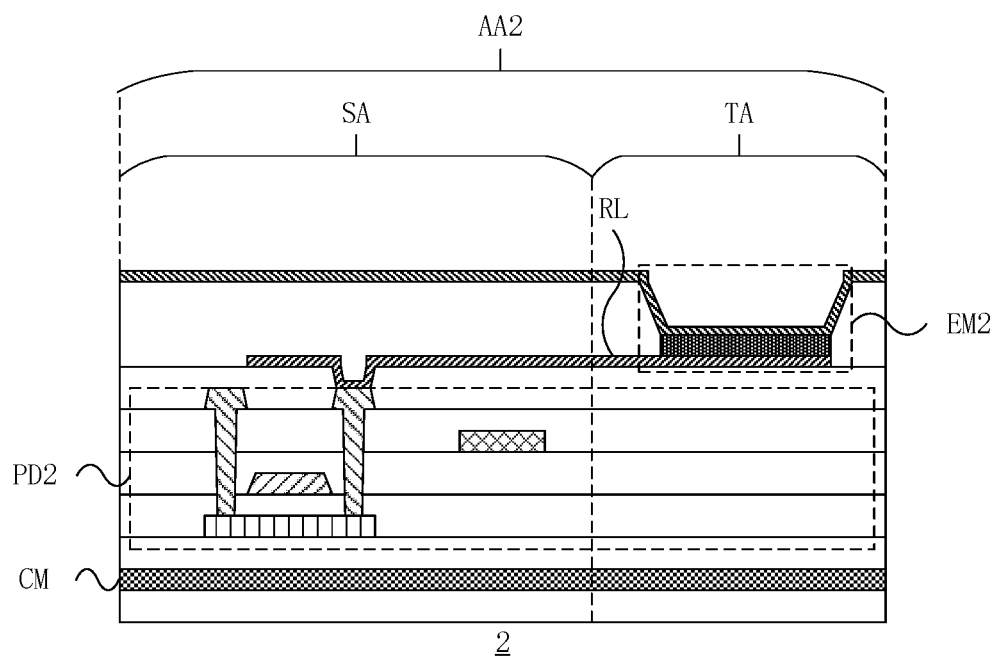
FIG. 4 is a schematic structural diagram of a second display area of a display panel according to an embodiment of the present disclosure.

As shown in FIGS. 2 to 4, a display panel 2 includes a display area AA. The display area AA includes a first display area AA1 and a second display area AA2. First light-emitting units EM1 and first pixel circuits PD1 are provided in the first display area AA1. Second light-emitting units EM2 and second pixel circuits PD2 are provided in the second display area AA2. In the first display area AA1, the first pixel circuits PD1 are distributed corresponding to an arrangement of the first light-emitting units EM1. The second display area AA2 includes S light-shielding areas SA and a light-transmitting area TA surrounding the S light-shielding areas SA. The second pixel circuits PD2 are all located in the light-shielding areas SA, and at least one second light-emitting unit EM2 is completely located in the light-transmitting area TA. S is a positive integer and S 1. Each of the at least one second light-emitting unit EM2 located in the light-transmitting area TA is connected to one respective second pixel circuit PD2 located in the light-shielding area SA through an anode connection line RL.

In the second display area AA2, a total number of the second pixel circuits PD2 may be equal to a total number of the second light-emitting units EM2, and the second light-emitting units EM2 may be electrically connected to the second pixel circuits PD2 in one-to-one correspondence. All the second pixel circuits PD2 are located in the light-shielding areas SA, and at least one but not all of the second light-emitting units EM2 are located in the light-transmitting area.

In the display area AA, the first display area AA1 displays images by utilizing the first light-emitting units EM1. The second display area AA2 displays images by utilizing the second light-emitting units EM2. In the first display area AA1, the first pixel circuit PD1 can drive the first light-emitting unit EM1 to emit light. In the second display area AA2, the second pixel circuit PD2 can drive the second light-emitting unit EM2 to emit light. The distribution of the first pixel circuits PD1 corresponds to the arrangement of the first light-emitting units EM1. One first light-emitting unit EM1 is located on one first pixel circuit PD1.

At the second display area AA2, the display panel covers a camera CM. The camera CM captures images under the display panel at the second display area AA2. In the second display area AA2, the light-transmitting area TA surrounds the S light-shielding areas SA. A light transmittance of the light-transmitting area TA is greater than a light transmittance of the light-shielding areas SA. At the light-transmitting area TA, the display panel is located above the camera CM. The camera CM receives light under the display panel at the light transmission area TA. The second pixel circuit PD2 is located in the light-shielding area SA. The second pixel circuit PD2 in the light-shielding area SA shields light. At least one second light-emitting unit EM2 is completely located in the light-transmitting area TA. The light-transmitting area TA except an area where the second light-emitting unit EM2 is located transmits light. In this way, the second pixel circuits PD2 in the second display area AA2 are collectively provided. The light-transmitting area TA of the second display area AA2 is enlarged and the light transmittance of the second display area AA2 is increased. An image capturing effect of the camera CM under the panel at the second display area AA2 is improved. At least one of the second light-emitting units EM2 is distributed in the light-shielding areas SA and at least one of the second light-emitting units EM2 is distributed in the light-transmitting area TA. The second light-emitting units EM2 in the second display area AA2 are uniformly distributed. The second display area AA2 displays images uniformly by utilizing the second light-emitting units EM2. Each second light-emitting unit EM2 located in the light-transmitting area TA is connected to one second pixel circuit PD2 located in the light-shielding area SA through the anode connection line RL. The second pixel circuit PD2 in the light-shielding area SA can also drive the second light-emitting unit EM2 in the light-transmitting area TA to emit light.

FIG. 2 illustrates only the case where the number of the light-shielding areas SA is one. The number of the light-shielding areas SA in the present disclosure is not limited to one.

As shown in FIGS. 2 to 4, in the second display area AA2, at least two second light-emitting units EM2 are completely located in the light-transmitting area TA, and each of the at least two second light-emitting units EM2 is connected to one second pixel circuit PD2 located in the light-shielding area SA respectively through one anode connection line RL. Among the anode connection lines RL that are respectively connected to the at least two second light-emitting units EM2, directions along which at least two anode connection lines RL extend cross each other.

At least two second light-emitting units EM2 in the second display area AA2 are completely located in the light transmission area TA. The light-transmitting area TA transmits light except in an area where the at least two second light-emitting units EM2 are located. Each of the at least two second light-emitting units EM2 in the light-transmitting area TA is connected to one respective second pixel circuit PD2 located in the light-shielding area SA through one respective anode connection line RL. At least two second pixel circuits PD2 in the light-shielding area SA can also drive at least two second light-emitting units EM2, respectively, in the light-transmitting area TA to emit light. The directions in which at least two anode connection lines RL of the anode connection lines RL respectively connected to the at least two second light-emitting units EM2 extend cross each other. For example, in the light-transmitting area TA, a second light-emitting unit EM2 arranged in a first row and a first column is connected to a first anode connection line RL. A second light-emitting unit EM2 arranged in the first row and a second column is connected to a second anode connection line RL. A direction in which the first anode connection line RL extends crosses a direction in which the second anode connection line RL extends. That is, an extending direction of the first anode connection line RL crosses an extending direction of the second anode connection line RL. As a result, arrangement and distribution of the anode connection lines RL become more random. A probability that light diffracts bypassing each anode connection line RL and interferes constructively becomes smaller. As a result, the performances of the camera CM in receiving light and in capturing images are further improved.

As shown in FIGS. 2 to 4, directions in which the anode connection lines respectively connected to the at least two second light-emitting units EM2 extend cross one another.

For example, in the light-transmitting area TA, a second light-emitting unit EM2 in a first row and a first column is connected to a first anode connection line RL, a second light-emitting unit EM2 in the first row and a second column is connected to a second anode connection line RL, and a second light-emitting unit EM2 in the first row and a third column is connected to a third anode connection line RL. An extending direction of the first anode connection line RL crosses an extending direction of the second anode connection line RL. The extending direction of the first anode connection line RL crosses an extending direction of the third anode connection line RL. The extending direction of the second anode connection line RL crosses the extending direction of the third anode connection line RL, and so on for the rest of the anode connection lines RL. In the light-transmitting area TA, eight second light-emitting units EM2 are connected to eight anode connection lines RL, respectively. Directions in which any two of the eight anode connection lines RL extend cross each other. Therefore, the arrangement and distribution of the anode connection lines RL are more random. The probability that light diffracts bypassing each anode connection line RL and interferes constructively becomes smaller. The performances of the camera CM in receiving light and in capturing images are further improved.

FIG. 2 illustrates the case where the number of the anode connection lines RL in the light-transmitting area TA is eight. The number of the anode connection lines RL in the light-transmitting area TA in the present disclosure is not limited to eight.

As shown in FIGS. 2 to 4, among the anode connection lines RL connected to the at least two second light-emitting units EM2, an included angle between extending directions of any two anode connection lines RL is different from an included angle between extending directions of any other two connection lines RL.

For example, in the light-transmitting area TA, a second light-emitting unit EM2 in a first row and a first column is connected to a first anode connection line RL, a second light-emitting unit EM2 in the first row and a second column is connected to a second anode connection line RL, and a second light-emitting unit EM2 in the first row and a third column is connected to a third anode connection line RL. An included angle between extending directions of the first and second anode connection lines RL is not equal to an included angle between extending directions of the first and third anode connection lines RL. The included angle between the extending directions of the first and second anode connection lines RL is not equal to an included angle between extending directions of the second and third anode connection lines RL. The included angle between the extending directions of the first and third anode connection lines RL is not equal to an included angle between the extending directions of the second and third anode connection lines RL. The rest of the anode connection lines RL are arranged similarly. In the light-transmitting area TA, eight second light-emitting units EM2 are connected to eight anode connection lines RL, respectively. An included angle between extending directions of any two of the eight anode connection lines RL is not equal to an included angle between extending directions of any other two of the eight anode connection lines RL. Therefore, the arrangement and distribution of the anode connection lines RL are more random. The probability that light diffracts bypassing each anode connection line RL and interferes constructively becomes smaller. As a result, the performances of the camera CM in receiving light and in capturing images are further improved.

As shown in FIGS. 2 to 4, a pixel circuit array PA is provided in at least one light-shielding area SA. The pixel circuit array PA includes second pixel circuits PD2 arranged in an array of M rows by N columns. M and N are positive integers, where M≥1 and N≥1. The second pixel circuits PD2 in the M rows and N columns of the pixel circuit array PA provide driving signals for M*N second light-emitting units EM2 through M*N anode connection lines RL, respectively. Extending directions of the M*N anode connection lines RL cross one another.

In the light-shielding area SA, the second pixel circuits PD2 of the M rows and N columns of the pixel circuit array PA are arranged in an array. For example, M rows and N columns of second pixel circuits PD2 include three rows and three columns of second pixel circuits PD2. The second pixel circuits PD2 of the M rows and N columns provide driving signals for M*N second light-emitting units EM2 through M*N anode connection lines RL, respectively. A second pixel circuit PD2 in a first row and a first column drives a first second light-emitting unit EM2 through a first anode connection line RL. A second pixel circuit PD2 in the first row and a second column drives a second light-emitting unit EM2 through a second anode connection line RL. A second pixel circuit PD2 in the first row and a third column drives a third second light-emitting unit EM2 through a third anode connection line RL. And so on for second pixel circuits PD2 in the rest of rows and columns. Extending directions of the M*N anode connection lines RL cross one another. In the light-transmitting area TA, an extending direction of the first anode connection line RL crosses an extending direction of the second anode connection line RL. The extending direction of the first anode connection line RL crosses an extending direction of the third anode connection line RL. The extending direction of the second anode connection line RL crosses the extending direction of the third anode connection line RL, and so on for the rest anode connection lines RL. In the light-transmitting area TA, second pixel circuits PD2 of three rows and three columns are connected to nine anode connection lines RL, respectively. Extending directions of any two of the nine anode connection lines RL cross each other. Therefore, the arrangement and distribution of the anode connection lines RL are more random. The probability that light diffracts bypassing each anode connection line RL and interferes constructively becomes smaller. The performances of the camera CM in receiving light and in capturing images are further improved.

FIG. 2 illustrates a case where M rows and N columns of second pixel circuits PD2 include three rows and three columns of second pixel circuits PD2. In the present disclosure, the M rows and N columns of second pixel circuits PD2 are not limited to the three rows and three columns of second pixel circuits PD2.

Figure 5:
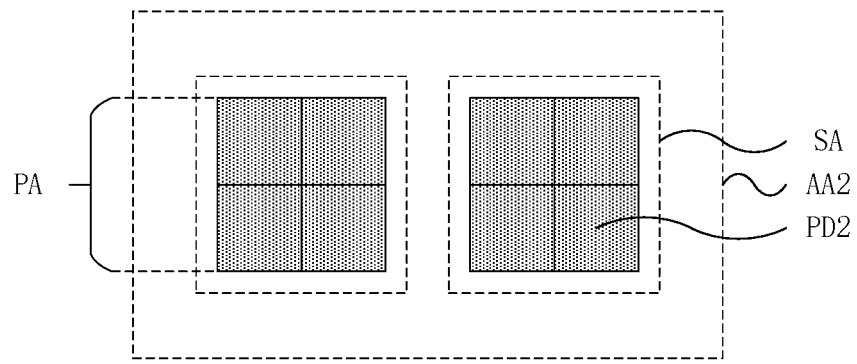
FIG. 5 is a schematic structural diagram of a second display area of another display panel according to an embodiment of the present disclosure.
Figure 6:
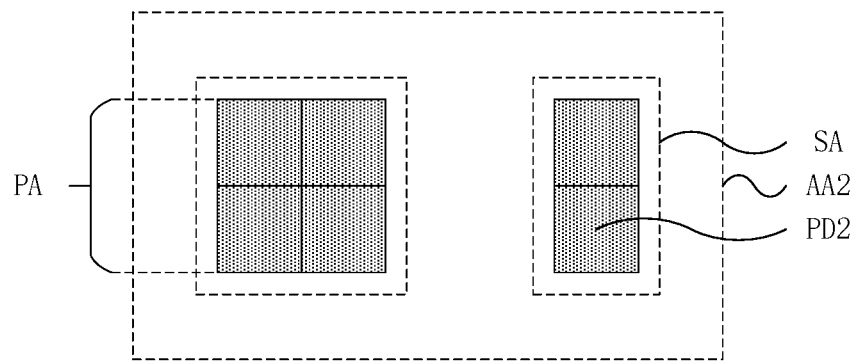
FIG. 6 is a schematic structural diagram of a second display area of another display panel according to an embodiment of the present disclosure.

FIG. 5 is a schematic structural diagram of a second display area of another display panel according to an embodiment of the present disclosure; and FIG. 6 is a schematic structural diagram of a second display area of still another display panel according to an embodiment of the present disclosure.

As shown in FIGS. 5 and 6, a pixel circuit array PA is provided in each light-shielding area SA, and the numbers of the second pixel circuits PD2 included in the pixel circuit arrays PA are the same or different.

For example, a first pixel circuit array PA is included in a first light-shielding area SA, and a second pixel circuit array PA is included in a second light-shielding area SA. In an embodiment, the number of the second pixel circuits PD2 of the first pixel circuit array PA is four, and the number of the second pixel circuits PD2 of the second pixel circuit array PA is four. The number of the second pixel circuits PD2 of the first pixel circuit array PA is equal to the number of the second pixel circuits PD2 of the second pixel circuit array PA. In another embodiment, the number of the second pixel circuits PD2 of the first pixel circuit array PA is four, and the number of the second pixel circuits PD2 of the second pixel circuit array PA is two. The number of the second pixel circuits PD2 of the first pixel circuit array PA is different from the number of the second pixel circuits PD2 of the second pixel circuit array PA. In this way, the number of the second pixel circuits PD2 of the pixel circuit array PA can be flexibly designed. The sizes of the pixel circuit array PA and the light-shielding area SA can be flexibly designed.

As shown in FIGS. 2 to 4, an included angle between extending directions of any two of the M*N anode connection lines RL is not equal to an included angle between extending directions of any other two of the M*N anode connection lines RL.

For example, in the light-transmitting area TA, the M*N anode connection lines RL include 9 anode connection lines RL. An included angle between extending directions of a first anode connection line RL and a second anode connection line RL is not equal to an included angle between extending directions of the first anode connection line RL and a third anode connection line RL. The included angle between the extending directions of the first anode connection line RL and the second anode connection line RL is not equal to an included angle between the extending directions of the second anode connection line RL and the third anode connection line RL. The included angle between the extending directions of the first anode connection line RL and the third anode connection line RL is not equal to the included angle between the extending directions of the second anode connection line RL and the third anode connection line RL, and so on, for the rest anode connection lines RL. An included angle between extending directions of any two of the 9 anode connection lines RL is not equal to an included angle between extending directions of any other two of the 9 anode connection lines RL. Therefore, the arrangement and distribution of the anode connection lines RL are more random. The probability that light diffracts bypassing each anode connection line RL and interferes constructively becomes smaller. As a result, the performances of the camera CM in receiving light and in capturing images are further improved.

Figure 7:
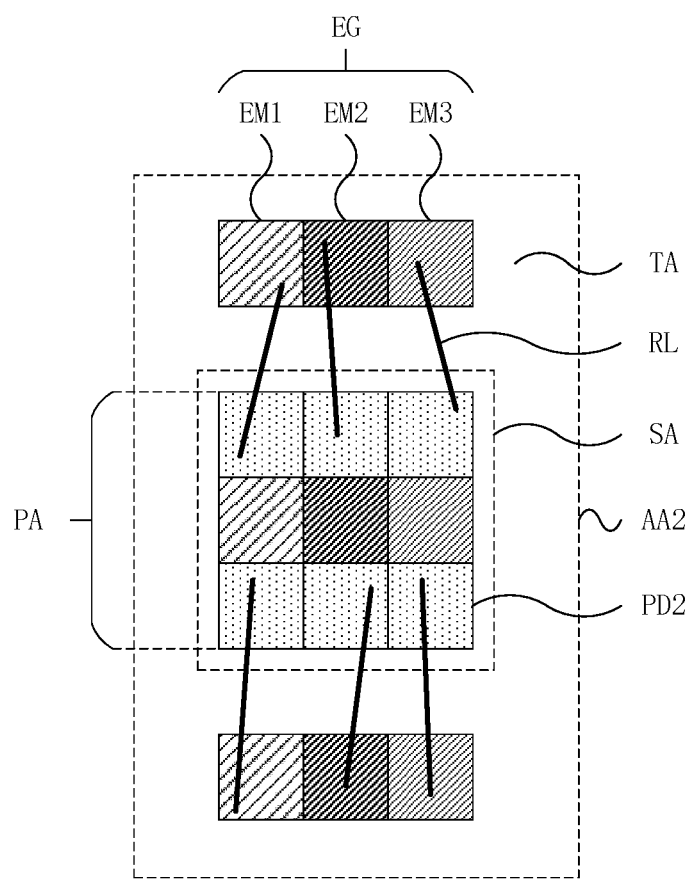
FIG. 7 is a schematic structural diagram of a second display area of another display panel according to an embodiment of the present disclosure.

FIG. 7 is a schematic structural diagram of a second display area of still another display panel according to an embodiment of the present disclosure.

As shown in FIG. 7, a plurality of light-emitting unit sets EG are provided in the light-transmitting area TA. The light-emitting unit set EG includes a first light-emitting unit EM1, a second light-emitting unit EM2, and a third light-emitting unit EM3 which are disposed adjacent to one another. The first light-emitting unit EM1 emits light of a first color, the second light-emitting unit EM2 emits light of a second color, and the third light-emitting unit EM3 emits light of a third color. Each of the first light-emitting unit EM1, the second light-emitting unit EM2, and the third light-emitting unit EM3 is connected to a second pixel circuit PD2 arranged in one light-shielding area SA through one anode connection line RL. Extending directions of the anode connection lines RL respectively connected to the first light-emitting unit EM1, the second light-emitting unit EM2, and the third light-emitting unit EM3 cross each other.

In the light-emitting unit set EG, the first light-emitting unit EM1, the second light-emitting unit EM2, and the third light-emitting unit EM3 are disposed adjacent to each other. The first light-emitting unit EM1, the second light-emitting unit EM2, and the third light-emitting unit EM3 are respectively a red pixel, a green pixel, and a blue pixel. The first light-emitting unit EM1 emits light of first color. The second light-emitting unit EM2 emits light of second color. The third light-emitting unit EM3 emits light of third color. The light of first color, the light of second color, and the light of third color are respectively red light, green light, and blue light. Each of the first light-emitting unit EM1, the second light-emitting unit EM2, and the third light-emitting unit EM3 is connected to the second pixel circuit PD2 arranged in one light-shielding area SA through one anode connection line RL. The first light-emitting unit EM1 is connected to a first second pixel circuit PD2 through a first anode connection line RL. The second light-emitting unit EM2 is connected to a second pixel circuit PD2 through a second anode connection line RL. The third light-emitting unit EM3 is connected to a third second pixel circuit PD2 through a third anode connection line RL. In the light-transmitting area TA, extending directions of the anode connection lines RL respectively connected to the first light-emitting unit EM1, the second light-emitting unit EM2, and the third light-emitting unit EM3 cross each other. An extending direction of the first anode connection line RL crosses an extending direction of the second anode connection line RL. The extending direction of the first anode connection line RL crosses an extending direction of the third anode connection line RL. The extending direction of the second anode connection line RL crosses the extending direction of the third anode connection line RL. Therefore, the arrangement and distribution of the anode connection lines RL are more random. The probability that light diffracts bypassing each anode connection line RL and interferes constructively becomes smaller. The performances of the camera CM in receiving light and in capturing images are further improved.

As shown in FIG. 7, an included angle between extending directions of any two of the anode connection lines RL respectively connected to the first light-emitting unit EM1, the second light-emitting unit EM2, and the third light-emitting unit EM3 is not equal to an included angle between extending directions of any other two of the anode connection lines RL.

The first light-emitting unit EM1, the second light-emitting unit EM2, and the third light-emitting unit EM3 are respectively a red pixel, a green pixel, and a blue pixel. The first light-emitting unit EM1 is connected to a first anode connection line RL. The second light-emitting unit EM2 is connected to a second anode connection line RL. The third light-emitting unit EM3 is connected to a third anode connection line RL. An included angle between extending directions of the first anode connection line RL and the second anode connection line RL is not equal to an included angle between extending directions of the first anode connection line RL and the third anode connection line RL. The included angle between the extending directions of the first anode connection line RL and the second anode connection line RL is not equal to an included angle between extending directions of the second anode connection line RL and the third anode connection line RL. The included angle between the extending directions of the first anode connection line RL and the third anode connection line RL is not equal to the included angle between the extending directions of the second anode connection line RL and the third anode connection line RL. The arrangement and distribution of the anode connection lines RL are more random. As a result, the probability that light diffracts bypassing each anode connection line RL and interferes constructively becomes smaller, and the performances of the camera CM in receiving light and in capturing images are further improved.

Figure 8:
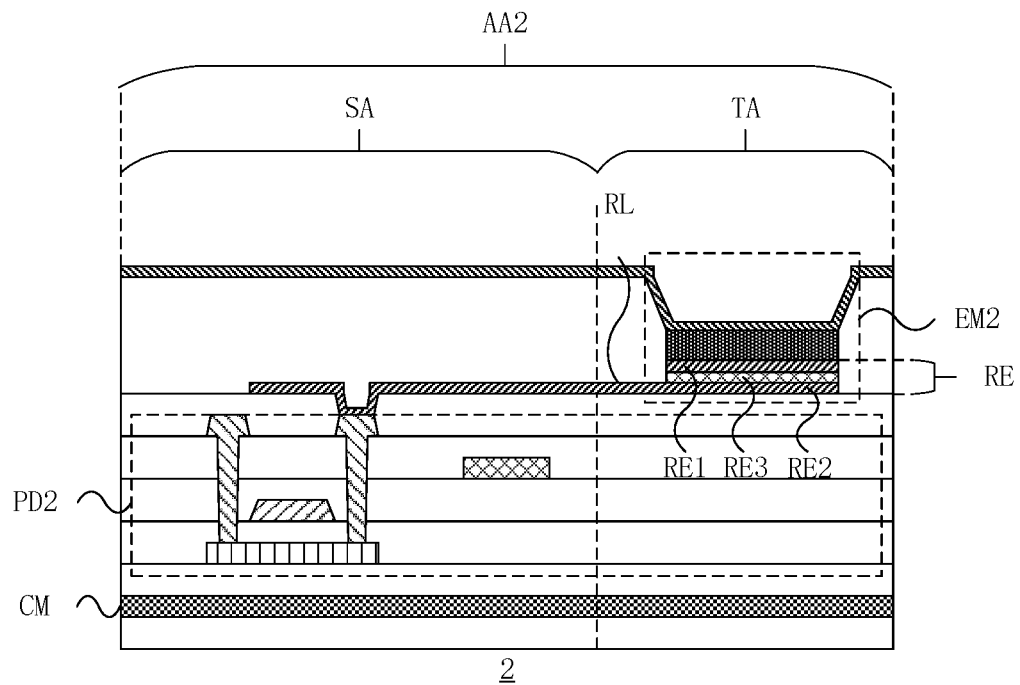
FIG. 8 is a schematic structural diagram of a second display area of another display panel according to an embodiment of the present disclosure.

FIG. 8 is a schematic structural diagram of a second display area of another display panel according to an embodiment of the present disclosure.

As shown in FIG. 8, the anode connection line RL is made of a transparent conductive material.

The transparent conductive material of the anode connection line RL is indium tin oxide. The transparent conductive material of the anode connection line RL has high light transmittance. The anode connection line RL extends into the light-transmitting area TA. The anode connection line RL does not affect the light transmittance of the light-transmitting area TA. Light transmittance of the light-transmitting area TA is greater than the light transmittance of the light-shielding area SA. The camera CM under the display panel at the second display area AA2 has a good performance in capturing images.

As shown in FIG. 8, an anode RE includes a first conductive layer RE1, a second conductive layer RE2, and a reflective layer RE3 that is located between the first conductive layer RE1 and the second conductive layer RE2, and the anode connection line RL is arranged in a same layer as the first conductive layer RE1 or the second conductive layer RE2.

In the anode RE, the reflective layer RE3 is located between the first conductive layer RE1 and the second conductive layer RE2. The first conductive layer RE1 is made of indium tin oxide, the reflective layer RE3 is made of silver, and the second conductive layer RE2 is made of indium tin oxide. In an embodiment, the anode connection line RL is disposed in a same layer as the first conductive layer RE1. The anode connection line RL and the first conductive layer RE1 are formed in a same process step, which simplifies the manufacturing of the anode connection line RL and the first conductive layer RE1. In another embodiment, the anode connection line RL and the second conductive layer RE2 are disposed in a same layer. The anode connection line RL and the second conductive layer RE2 are formed in a same process step, which simplifies the manufacturing of the anode connection line RL and the second conductive layer RE2.

Figure 9:
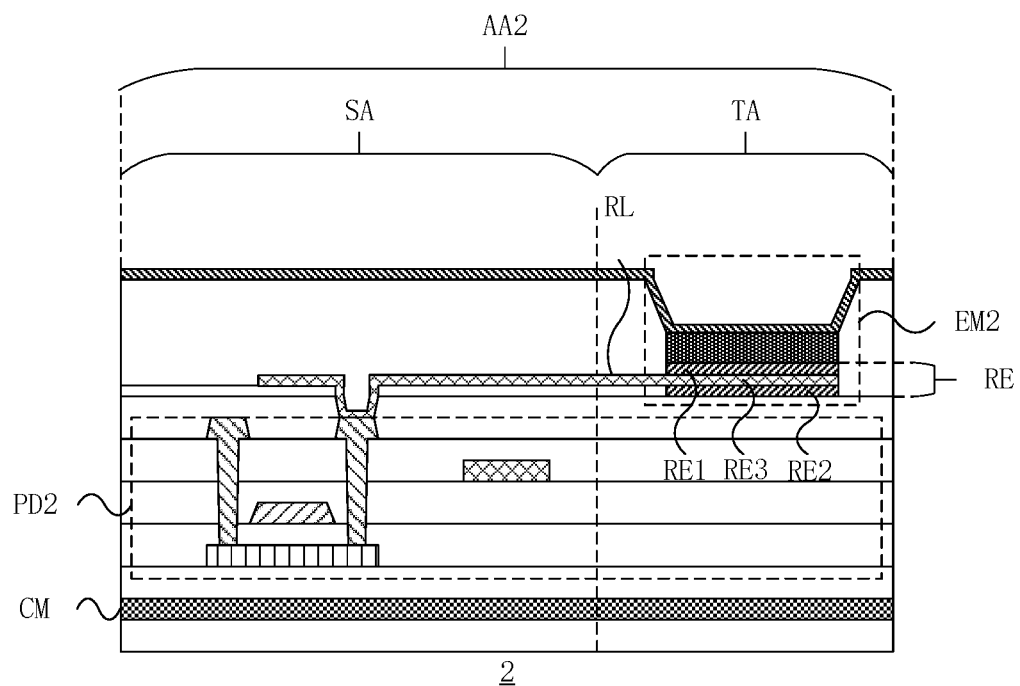
FIG. 9 is a schematic structural diagram of a second display area of another display panel according to an embodiment of the present disclosure.

FIG. 9 is a schematic diagram of a second display area of another display panel according to an embodiment of the present disclosure.

As shown in FIG. 9, the anode connection line RL is made of a metal material.

The metal material of the anode connection line RL is silver. The metal material of the anode connection line RL has high electrical conductivity. The anode connection line RL is connected to both the second pixel circuit PD2 and the second light-emitting unit EM2. The second pixel circuit PD2 has a small IR drop when driving the second light-emitting unit EM2 through the anode connection line RL. The second pixel circuit PD2 has a good performance in driving the second light-emitting unit EM2 through the anode connection line RL.

As shown in FIG. 9, the anode RE includes the first conductive layer RE1, the second conductive layer RE2, and a reflective layer RE3 that is located between the first conductive layer RE1 and the second conductive layer RE2, and the anode connection line RL is disposed in a same layer as the reflective layer RE3.

In the anode RE, the reflective layer RE3 is located between the first conductive layer RE1 and the second conductive layer RE2. The first conductive layer RE1 is made of indium tin oxide, the reflective layer RE3 is made of silver, and the second conductive layer RE2 is made of indium tin oxide. The anode connection line RL is disposed in a same layer as the reflective layer RE3. The anode connection line RL and the reflective layer RE3 are formed in a same process step, which simplifies the manufacturing of the anode connection line RL and the reflective layer RE3.

Figure 10:
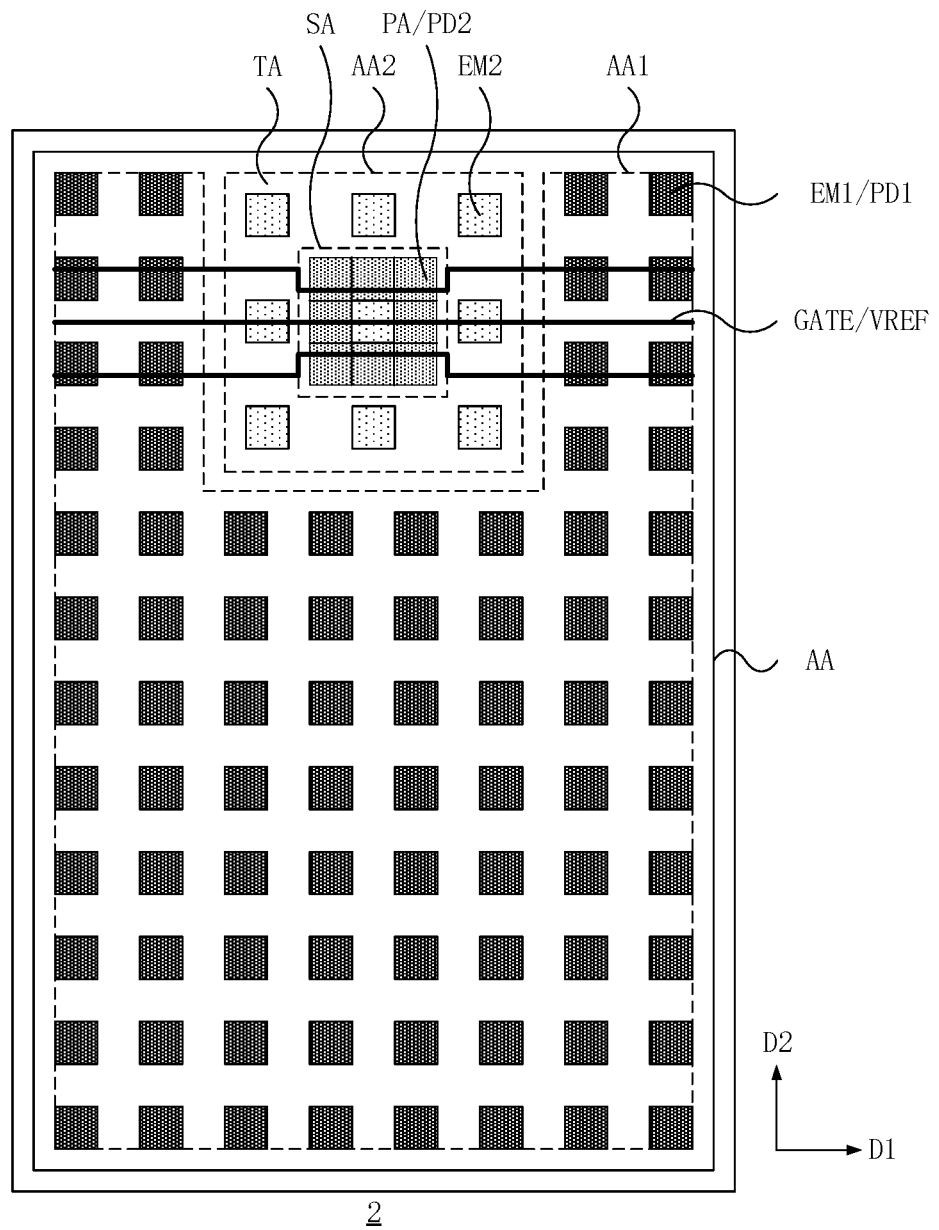
FIG. 10 is a schematic structural diagram of another display panel according to an embodiment of the present disclosure.
Figure 11:
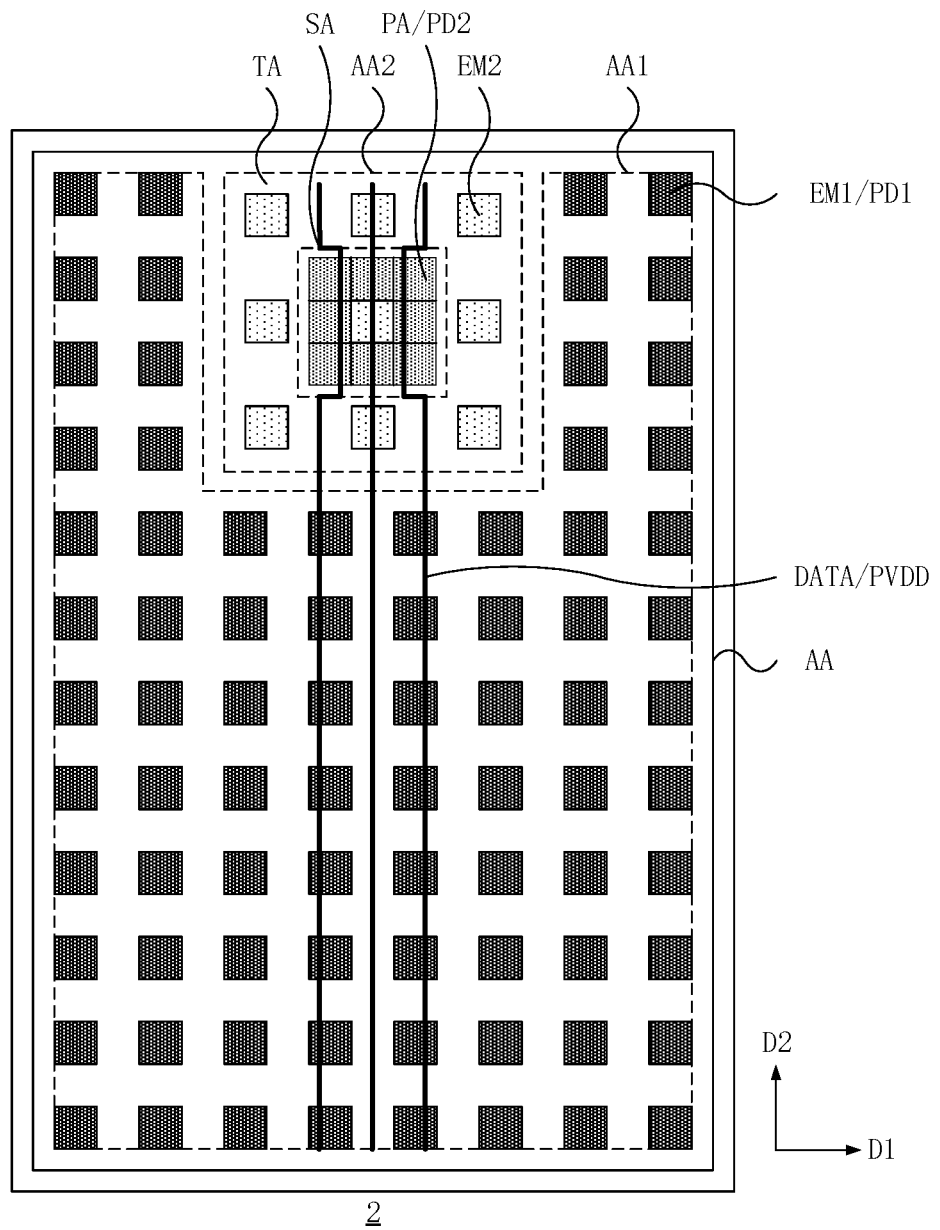
FIG. 11 is a schematic structural diagram of another display panel according to an embodiment of the present disclosure.

FIG. 10 is a schematic structural diagram of another display panel according to an embodiment of the present disclosure; and FIG. 11 is a schematic structural diagram of another display panel according to an embodiment of the present disclosure.

As shown in FIGS. 10 and 11, the display panel 2 further includes gate signal lines GATE and data signal lines DATA. The gate signal lines GATE extend in a first direction D1, and the data signal lines DATA extend in a second direction D2. A distance between two adjacent gate signal lines GATE in the light-transmitting area TA along the second direction D2 is greater than a distance between the two adjacent gate signal lines GATE in the light-shielding area SA along the second direction D2, and/or, a distance between two adjacent data signal lines DATA in the light-transmitting area TA along the first direction D1 is greater than a distance between the two adjacent data signal lines DATA in the light-shielding area SA along the first direction D1.

The gate signal lines GATE extend in the first direction D1. The gate signal lines GATE are configured to transmit gate signals. The gate signal lines GATE include scan signal lines SCAN and emission signal lines EMIT. The scan signal lines SCAN are configured to transmit scan signals. The emission signal lines EMIT are configured to transmit emission signals. The distance between two adjacent gate signal lines GATE in the light-transmitting area TA along the second direction D2 is greater than the distance between the two adjacent gate signal lines GATE in the light-shielding area SA along the second direction D2. Diffraction of light passing through a gap between the two adjacent gate signal lines GATE in the light-transmitting area TA is weakened. The performances of the camera CM in receiving light and in capturing images are further improved. The data signal lines DATA extend in the second direction D2. The data signal lines DATA are configured to transmit data signals. The distance between two adjacent data signal lines DATA in the light-transmitting area TA along the first direction D1 is greater than the distance between the two adjacent data signal lines DATA in the light-shielding area SA along the first direction D1. The diffraction of light passing through a gap between the two adjacent data signal lines DATA in the light-transmitting area TA is weakened. The performances of the camera CM in receiving light and in capturing images are further improved.

The display panel 2 further includes reference signal lines VREF and power signal lines PVDD. The reference signal lines VREF extend in the first direction D1 and are configured to transmit reference signals. A distance between two adjacent reference signal lines VREF in the light-transmitting area TA along the second direction D2 is greater than a distance between the two adjacent reference signal lines VREF in the light-shielding area SA along the second direction D2. Diffraction of light passing through a gap between the two adjacent reference signal lines VREF in the light-transmitting area TA is weakened. The performances of the camera CM in receiving light and in capturing images are further improved. The power signal line PVDD extends in the second direction D2. The power signal lines PVDD are configured to transmit power signals. A distance between two adjacent power signal lines PVDD in the light-transmitting area TA along the first direction D1 is greater than a distance between the two adjacent power signal lines PVDD in the light-shielding area SA along the first direction D1. Diffraction of light passing through a gap between the two adjacent power signal lines PVDD in the light-transmitting area TA is weakened. As a result, the performances of the camera CM in receiving light and in capturing images are further improved.

As shown in FIGS. 2, 10 and 11, an extending direction of each anode connection line RL crosses both the first direction D1 and the second direction D2.

The extending direction of each anode connection line RL extends crosses both the first direction D1 and the extending direction of the gate signal lines GATE. A probability that light diffracts bypassing the anode connection lines RL and the gate signal lines GATE and interferes constructively is reduced. The performances of the camera CM in receiving light and in capturing images are further improved. The extending direction of each anode connection line RL crosses the extending direction of the reference signal lines VREF. A probability that light diffracts bypassing the anode connection lines RL and the reference signal lines VREF and interferes constructively is reduced. The performances of the camera CM in receiving light and in capturing images are further improved.

The extending direction of each anode connection line RL crosses the second direction D2. The extending direction of each anode connection line RL crosses the extending direction of the data signal lines DATA. A probability that light diffracts bypassing the anode connection lines RL and the data signal lines DATA and interferes constructively is reduced. The performances of the camera CM in receiving light and in capturing images are further improved. The extending direction of each anode connection line RL crosses the extending direction of the power signal lines PVDD. A probability that light diffracts bypassing the anode connection lines RL and the power signal lines PVDD and interferes constructively is reduced. The performances of the camera CM in receiving light and in capturing images are further improved.

Figure 12:
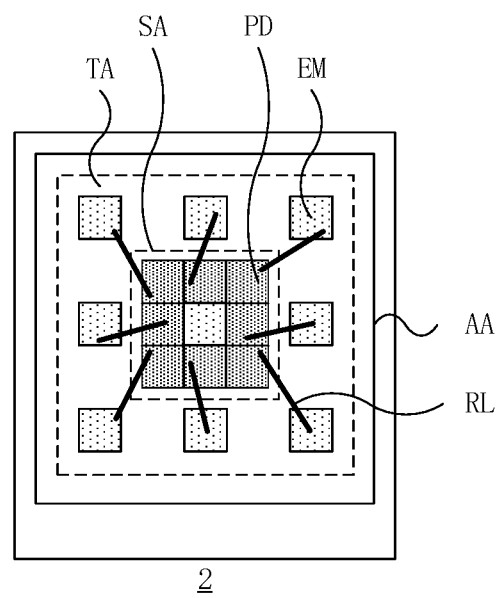
FIG. 12 is a schematic structural diagram of another display panel according to an embodiment of the present disclosure.
Figure 13:
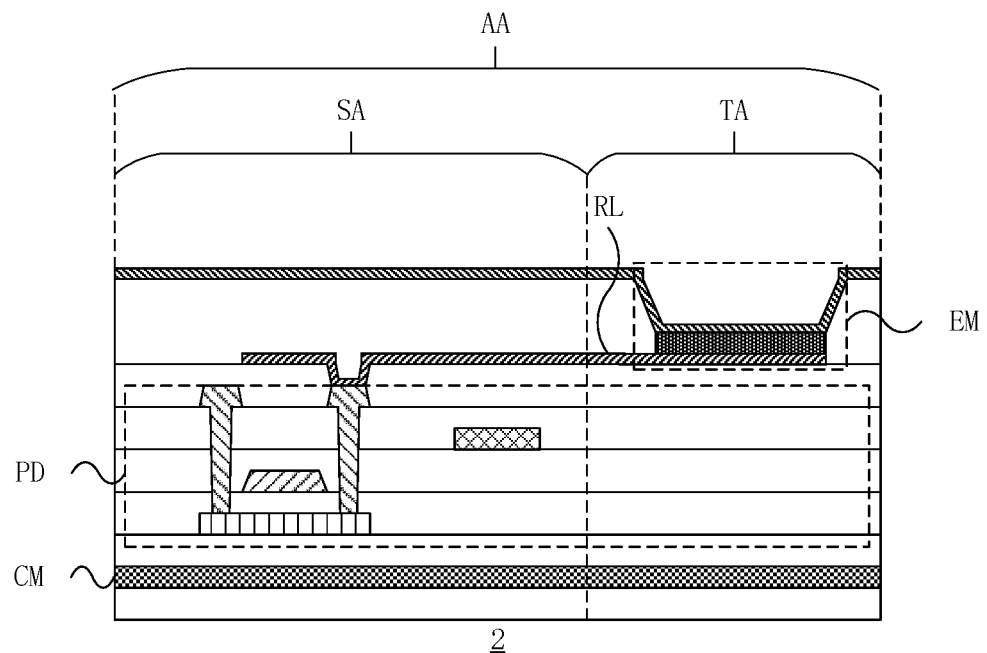
FIG. 13 is a schematic structural diagram of a display area of another display panel according to an embodiment of the present disclosure.

FIG. 12 is a schematic structural diagram of another display panel according to an embodiment of the present disclosure, and FIG. 13 is a schematic structural diagram of a display area in another display panel according to an embodiment of the present disclosure.

As shown in FIGS. 12 and 13, the display panel 2 has a display area AA. Light-emitting units EM and pixel circuits PD are provided in the display area AA. The display area AA includes S light-shielding areas SA and a light-transmitting area TA surrounding the S light-shielding areas SA. The pixel circuits PD are all located in the light-shielding areas SA, and at least one of the light-emitting units EM is completely located in the light-transmitting area TA. S is a positive integer, and S≥1. Each light-emitting unit EM located in the light-transmitting area TA is connected to one pixel circuit PD that is located in the light-shielding area SA through one anode connection line RL.

In the display area AA, the display panel covers the camera CM. The camera CM captures images under the display panel at the display area AA. In the display area AA, the light-transmitting area TA surrounds the S light-shielding areas SA. A light transmittance of the light-transmitting area TA is greater than a light transmittance of the light-shielding areas SA. The display panel is located above the camera CM at light-transmitting area TA. The camera CM receives light under the display panel at the light-transmitting area TA. The pixel circuits PD are located in the light-shielding areas SA. The pixel circuits PD located in the light-shielding areas SA shield light. At least one light-emitting unit EM is completely located in the light-transmitting area TA. The light-transmitting area TA except an area where the light-emitting unit EM is located transmits light. In this way, the pixel circuits PD located in the display area AA are collectively provided. The light-transmitting area TA of the display area AA is enlarged. The light transmittance of the display area AA is increased. The performance of the camera CM in capturing images under the display area AA is improved. The light-emitting units EM are distributed not only in the light-shielding areas SA but also in the light-transmitting area TA. The light-emitting units EM located in the display area AA are uniformly distributed. The display area AA displays images uniformly utilizing the light-emitting units EM. Each light-emitting unit EM located in the light-transmitting area TA is connected to one pixel circuit PD located in the light-shielding area SA through one anode connection line RL. The pixel circuit PD located in the light-shielding area SA can still drive the light-emitting unit EM located in the light-transmitting area TA to emit light.

FIG. 12 illustrates only the case where the number of the light-shielding areas SA is one. The number of the light-shielding areas SA in the present disclosure is not limited to one.

As shown in FIGS. 12 and 13, in the display area AA, at least two light-emitting units EM are completely located in the light-transmitting area TA, and each of the at least two light-emitting unit EM is connected to one pixel circuit PD located in the light-shielding area SA through one anode connection line RL. Extending directions of at least two of the anode connection lines RL that are respectively connected to the at least two light-emitting units EM cross each other.

At least two light-emitting units EM in the display area AA are completely located in the light-transmitting area TA. The light-transmitting area TA except an area where the at least two light-emitting units EM are located transmits light. Each of the at least two light-emitting units EM located in the light-transmitting area TA is connected to one pixel circuit PD located in the light-shielding area SA through one anode connection line RL. At least two pixel circuits PD located in the light-shielding areas SA can still drive the at least two light-emitting units EM located in the light-transmitting area TA to emit light, respectively. Extending directions of at least two of the anode connection lines RL respectively connected to the at least two light-emitting units EM cross each other. For example, in the light-transmitting area TA, a light-emitting unit EM in a first row and a first column is connected to a first anode connection line RL. A light-emitting unit EM in the first row and a second column is connected to a second anode connection line RL. Extending directions of the first anode connection line RL and the second anode connection line RL cross each other. As a result, the arrangement and distribution of the anode connection lines RL become more random. The probability that light diffracts bypassing each anode connection line RL and interferes constructively becomes smaller. The performances of the camera CM in receiving light and in capturing images are further improved.

As shown in FIGS. 12 and 13, extending directions of the anode connection lines RL respectively connected to the at least two light-emitting units EM cross one another.

For example, in the light-transmitting area TA, a light-emitting unit EM in a first row and a first column is connected to a first anode connection line RL. A light-emitting unit EM in the first row and a second column is connected to a second anode connection line RL. A light-emitting unit EM in the first row and a third column is connected to a third anode connection line RL. Extending directions of the first anode connection line RL and the second anode connection line RL cross each other. Extending directions of the first anode connection line RL and the third anode connection line RL cross each other. Extending directions of the second anode connection line RL and the third anode connection line RL cross each other. And so on for the rest anode connection lines RL. In the light-transmitting area TA, eight light-emitting units EM are connected to eight anode connection lines RL, respectively. Extending directions of any two of the eight anode connection lines RL cross each other. Therefore, the arrangement and distribution of the anode connection lines RL are more random. The probability that light diffracts bypassing each anode connection line RL and interferes constructively becomes smaller. As a result, the performances of the camera CM in receiving light and in capturing images are further improved.

FIG. 12 illustrates the case where the number of the anode connection lines RL located in the light-transmitting area TA is eight. The number of the anode connection lines RL located in the light-transmitting area TA in the present disclosure is not limited to eight.

As shown in FIGS. 12 and 13, an included angle between extending directions of any two of the anode connection lines RL respectively connected to the at least two light-emitting units EM is not equal to an included angle between extending directions of any other two of the anode connection lines RL.

For example, in the light-transmitting area TA, a light-emitting unit EM in a first row and a first column is connected to a first anode connection line RL. A light-emitting unit EM in the first row and a second column is connected to a second anode connection line RL. A light-emitting unit EM in the first row and a third column is connected to a third anode connection line RL. An included angle between extending directions of the first anode connection line RL and the second anode connection line RL is not equal to an included angle between extending directions of the first anode connection line RL and the third anode connection lines RL. The included angle between the extending directions of the first anode connection line RL and the second anode connection line RL is not equal to an included angle between extending directions of the second anode connection line RL and the third anode connection line RL. The included angle between the extending directions of the first anode connection line RL and the third anode connection line RL is not equal to the included angle between the extending directions of the second anode connection line RL and the third anode connection line RL, and so on for the rest of the anode connection lines RL. In the light-transmitting area TA, eight light-emitting units EM are connected to eight anode connection lines RL, respectively. An included angle between extending directions of any two of the eight anode connection lines RL is not equal to an included angle between extending directions of any other two of the eight anode connection lines RL. Therefore, the arrangement and distribution of the anode connection lines RL are more random. The probability that light diffracts bypassing each anode connection line RL and interferes constructively becomes smaller. As a result, the performances of the camera CM in receiving light and in capturing images are further improved.

Figure 14:
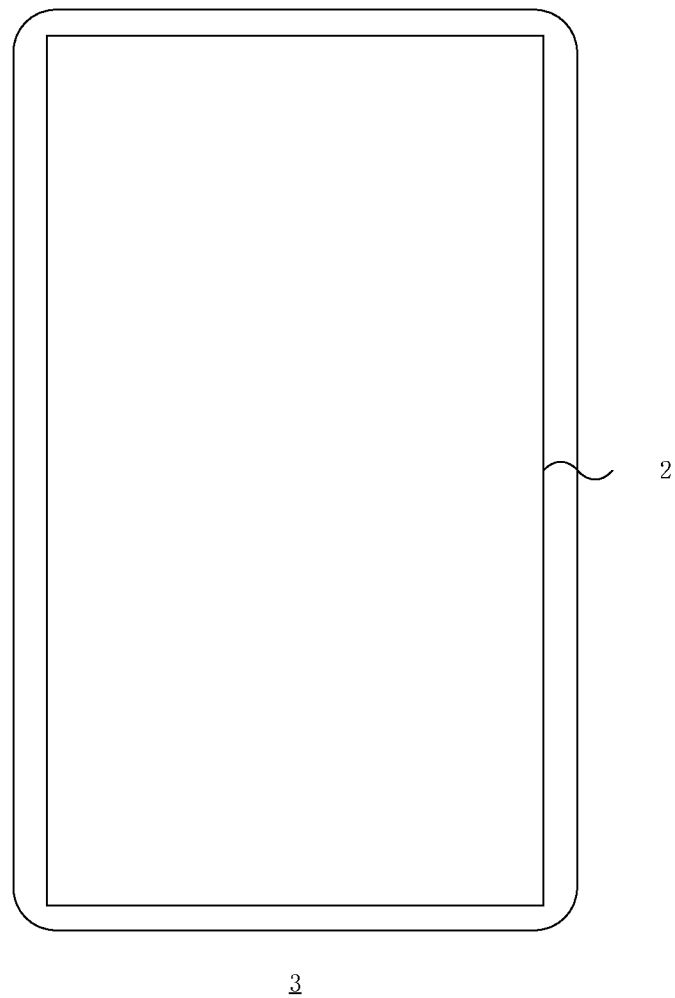
FIG. 14 is a schematic structural diagram of a display device according to an embodiment of the present disclosure.

FIG. 14 is a schematic structural diagram of a display device according to an embodiment of the present disclosure.

As shown in FIG. 14, the display device 3 includes a display panel 2.

The display device 3 may be a smartphone or other electronic device that is configured to display images utilizing the display panel 2. The display panel 2 is as described above and is not repeated herein.

The present disclosure provides a display panel and a display device. The display panel includes a display area including a first display area and a second display area. First light-emitting units and first pixel circuits are provided in the first display area, and second light-emitting units and second pixel circuits are provided in the second display area. In the first display area, the first pixel circuits are distributed corresponding to an arrangement of the first light-emitting units. The second display area includes S light-shielding areas and a light-transmitting area surrounding the S light-shielding areas. The second pixel circuits are all located in the light-shielding areas, and at least one of the second light-emitting unit is completely located in the light-transmitting area. Here, S is a positive integer, and S≥1. Each second light-emitting unit located in the light-transmitting area is connected to one second pixel circuit located in the light-shielding area through an anode connection line. In this way, the second pixel circuits located in the second display area are collectively provided. The light-transmitting area of the second display area is enlarged. The light transmittance of the second display area is increased. The performance of the camera in capturing images under the second display area is improved.

The above are only exemplary embodiments of the present disclosure and are not intended to limit the present disclosure. Any modification, equivalent replacement, or improvement made within the principle of the present disclosure should fall into the protection scope of the present disclosure.

What is claimed is:

1. A display panel having a display area comprising a first display area and a second display area, wherein the display panel comprises:
    first light-emitting units and first pixel circuits in the first display area; and second light-emitting units and second pixel circuits in the second display area, wherein the second display area comprises at least one light-shielding area and at least one light-transmitting area, wherein at least one second pixel circuit of the second pixel circuits is located in the at least one light-shielding area, and at least one second light-emitting unit of the second light-emitting units is located in the at least one light-transmitting area; and wherein one of the at least one second light-emitting unit is connected to one of the at least one second pixel circuit through one of anode connection lines.

2. The display panel according to claim 1, wherein the at least one second light-emitting unit comprises at least two second light-emitting units, and the at least one second pixel circuit comprises at least two second pixel circuits; in the second display area, the at least two second light-emitting units are located in the at least one light-transmitting area; and the at least two second light-emitting units are respectively connected, through at least two of the anode connection lines, to the at least two second pixel circuits; and wherein extending directions of at least two of the at least two anode connection lines that are respectively connected to the at least two second light-emitting units cross each other.

3. The display panel according to claim 1, wherein a pixel circuit array is provided in at least one of the at least one light-shielding area, the pixel circuit array comprising second pixel circuits arranged in an array of M rows by N columns, where M and N are positive integers;

wherein the second pixel circuits arranged in the M rows and N columns respectively provide driving signals for M*N second light-emitting units of the second light-emitting units through M*N anode connection lines of the anode connection lines; and wherein extending directions of the M*N anode connection lines cross each other.

4. The display panel according to claim 3, wherein the pixel circuit array is provided in each of the at least one light-shielding area, and a number of the second pixel circuits comprised in the pixel circuit array in one of the at least one light-shielding area is the same as a number of the second pixel circuits comprised in the pixel circuit array in another one of the at least one light-shielding area.

5. The display panel according to claim 1, wherein a plurality of sets of light-emitting units is provided in the at least one light-transmitting area, and each set of the plurality of sets of light-emitting units comprises a first light-emitting unit configured to emit light of a first color, a second light-emitting unit configured to emit light of a second color, and a third light-emitting unit configured to emit light of a third color, wherein the first light-emitting unit, the second light-emitting unit, and the third light-emitting unit are adjacent to each other;

wherein the first light-emitting unit, the second light-emitting unit, and the third light-emitting unit are connected to three of the at least one second pixel circuit through three anode connection lines of the anode connection lines, respectively; and wherein extending directions of the three anode connection lines cross each other.

6. The display panel according to claim 1, wherein the anode connection lines are made of a transparent conductive material.

7. The display panel according to claim 6, wherein an anode of one of the second light-emitting units comprises a first conductive layer, a second conductive layer, and a reflective layer located between the first conductive layer and the second conductive layer, and one of the anode connection lines is disposed in a same layer as the first conductive layer or the second conductive layer.

8. The display panel according to claim 1, wherein the anode connection lines are made of a metal material.

9. The display panel according to claim 8, wherein an anode of one of the second light-emitting units comprises a first conductive layer, a second conductive layer, and a reflective layer located between the first conductive layer and the second conductive layer, and one of the anode connection lines is disposed in a same layer as the reflective layer.

10. The display panel according to claim 1, further comprising:

gate signal lines each extending in a first direction; and
data signal lines each extending in a second direction,
wherein a distance between two adjacent gate signal lines of the gate signal lines in the light-transmitting area in the second direction is greater than a distance between the two adjacent gate signal lines in the at least one light-shielding area in the second direction, and/or,
a distance between two adjacent data signal lines of the data signal lines in the light-transmitting area in the first direction is greater than a distance between the two adjacent data signal lines in the at least one light-shielding area in the first direction.

11. The display panel according to claim 10, wherein an extending direction of one of the anode connection lines crosses both the first direction and the second direction.

12. A display panel having a display area comprising a first display area and a second display area, wherein the display panel comprises:

first light-emitting units and first pixel circuits in the first display area; and second light-emitting units and second pixel circuits in the second display area, wherein the second display area comprises at least one light-transmitting area, and one of the second light-emitting units is connected to one of the second pixel circuits through one of anode connection lines; and wherein one of the anode connection lines comprises a first connection line segment, wherein the first connection line segment is disposed in a same layer as at least one conductive layer of an anode of one of the second light-emitting units.

13. The display panel according to claim 12, wherein the second display area further comprises at least one light-shielding area, wherein at least one second pixel circuit of the second pixel circuits is located in the at least one light-shielding area, and at least two second light-emitting units of the second light-emitting units are located in the at least one light-transmitting area and are connected to at least two of the second pixel circuits through at least two anode connection lines of the anode connection lines; and wherein extending directions of at least two of the at least two anode connection lines cross each other.

14. The display panel according to claim 12, wherein a pixel circuit array is provided in at least one of the at least one light-shielding area, the pixel circuit array comprising second pixel circuits arranged in an array of M rows by N columns, where M and N are positive integers;

wherein the second pixel circuits arranged in the M rows and N columns respectively provide driving signals for M*N second light-emitting units of the second light-emitting units through M*N anode connection lines of the anode connection lines; and wherein extending directions of the M*N anode connection lines cross each other.

15. The display panel according to claim 14, wherein the pixel circuit array is provided in each of the at least one light-shielding area, and a number of the second pixel circuits comprised in the pixel circuit array in one of the at least one light-shielding area is the same as or different from a number of the second pixel circuits comprised in the pixel circuit array in another one of the at least one light-shielding area.

16. The display panel according to claim 12, wherein a plurality of sets of light-emitting units is provided in the at least one light-transmitting area, and each set of the plurality of sets of light-emitting units comprises a first light-emitting unit configured to emit light of a first color, a second light-emitting unit configured to emit light of a second color, and a third light-emitting unit configured to emit light of a third color, wherein the first light-emitting unit, the second light-emitting unit, and the third light-emitting unit are adjacent to each other;
wherein the first light-emitting unit, the second light-emitting unit, and the third light-emitting unit are connected to three of the at least one second pixel circuit through three anode connection lines of the anode connection lines, respectively; and
wherein extending directions of the three anode connection lines cross each other.

17. The display panel according to claim 12, wherein the anode connection lines are made of a transparent conductive material.

18. The display panel according to claim 17, wherein an anode of one of the second light-emitting units comprises a first conductive layer, a second conductive layer, and a reflective layer located between the first conductive layer and the second conductive layer, and one of the anode connection lines is disposed in a same layer as the first conductive layer or the second conductive layer.

19. The display panel according to claim 12, wherein the anode connection lines are made of a metal material.

20. The display panel according to claim 19, wherein an anode of one of the second light-emitting units comprises a first conductive layer, a second conductive layer, and a reflective layer located between the first conductive layer and the second conductive layer, and one of the anode connection lines is disposed in a same layer as the reflective layer.

21. The display panel according to claim 1, further comprising:
gate signal lines each extending in a first direction; and
data signal lines each extending in a second direction,
wherein a distance between two adjacent gate signal lines of the gate signal lines in the light-transmitting area in the second direction is greater than a distance between the two adjacent gate signal lines in the at least one light-shielding area in the second direction, and/or,
a distance between two adjacent data signal lines of the data signal lines in the light-transmitting area in the first direction is greater than a distance between the two adjacent data signal lines in the at least one light-shielding area in the first direction.

22. The display panel according to claim 21, wherein an extending direction of one of the anode connection lines crosses both the first direction and the second direction.

23. A display device, comprising:
a display panel,
wherein the display panel has a display area comprising a first display area and a second display area, and comprises first light-emitting units and first pixel circuits that are located in the first display area, and second light-emitting units and second pixel circuits that are located in the second display area; and
wherein the second display area comprises at least one light-shielding area and at least one light-transmitting area, wherein at least one second pixel circuit of the second pixel circuits is located in the at least one light-shielding area, and at least one second light-emitting unit of the second light-emitting units is located in the at least one light-transmitting area; and one of the at least one second light-emitting unit is connected to one of the at least one second pixel circuit through one of anode connection lines; or
wherein the second display area comprises at least one light-transmitting area, and one of the second light-emitting units is connected to one of the second pixel circuits through one of anode connection lines; and one of the anode connection lines comprises a first connection line segment, wherein the first connection line segment is disposed in a same layer as at least one conductive layer of an anode of one of the second light-emitting units.

* * * * *